United States Patent
Cui et al.

(10) Patent No.: US 6,625,234 B1
(45) Date of Patent: Sep. 23, 2003

(54) EFFICIENT IMPLEMENTATIONS OF PROPOSED TURBO CODE INTERLEAVERS FOR THIRD GENERATION CODE DIVISION MULTIPLE ACCESS

(75) Inventors: Jian Cui, Nepean (CA); Bin Li, Ottawa (CA); Wen Tong, Ottawa (CA); Rui R. Wang, Ottawa (CA)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 09/359,539

(22) Filed: Jul. 22, 1999

Related U.S. Application Data (60) Provisional application No. 60/111,747, filed on Dec. 10, 1998.

(51) Int. Cl.[7] ............................................... H04L 27/06
(52) U.S. Cl. ....................................... 375/341; 714/795
(58) Field of Search ............................... 375/265, 340, 375/341, 342, 140; 714/701, 702, 786, 781, 755, 758, 759, 761, 762, 763, 774, 790, 792, 791, 795, 794

(56) References Cited

U.S. PATENT DOCUMENTS

| | | | | |
|---|---|---|---|---|
| 5,912,898 | A | * | 6/1999 | Khoury ........................ 714/701 |
| 6,044,116 | A | * | 3/2000 | Wang .......................... 375/265 |
| 6,178,530 | B1 | * | 1/2001 | Aman et al. ................. 714/702 |
| 6,198,733 | B1 | * | 3/2001 | Prasad ......................... 370/342 |
| 6,304,991 | B1 | * | 10/2001 | Rowitch et al. ............. 714/755 |
| 6,353,900 | B1 | * | 3/2002 | Sindhushayana et al. ... 714/701 |

FOREIGN PATENT DOCUMENTS

| | | |
|---|---|---|
| EP | 0 928 071 A | 7/1999 |
| FR | 2 747 255 A | 10/1997 |
| WO | WO 96/24098 A | 8/1996 |

OTHER PUBLICATIONS

Barbulescu A S et al: "Interleaver Design for Turbo Codes" Electronic Letters, GB, IEE Stevenage, vol. 30, No. 25, Dec. 8, 1994, pp. 2107–2108 XP000501850.

* cited by examiner

*Primary Examiner*—Chi Pham
*Assistant Examiner*—Khanh Cong Tran
(74) *Attorney, Agent, or Firm*—Gibbons, Del Deo, Dolan, Griffinger & Vecchione (57) ABSTRACT

The invention relates to methods and apparatus for Turbo Code interleavers for use with third generation code division multiple access (3G CDMA) data. The apparatus includes a memory for receiving and temporarily storing the data, a counter and a clock coupled to the memory and counter for synchronization. The apparatus also includes a table containing a addresses that are selected by the counter. A puncturing device coupled to the table discards addresses if they are greater than a frame size. A buffer is coupled to the memory and the clock. The memory is configured to retrieve data from the selected addresses which are not discarded and forward it to the buffer for output.

21 Claims, 9 Drawing Sheets

EFFICIENT IMPLEMENTATIONS OF PROPOSED TURBO CODE INTERLEAVERS FOR THIRD GENERATION CODE DIVISION MULTIPLE ACCESS

CROSS-REFERENCE TO RELATED APPLICATIONS

This application claims the benefit of U.S. Provisional Application No. 60/111,747, filed Dec. 10, 1998.

FIELD OF THE INVENTION

This invention relates to the field of electronic communications systems and, more particularly, to interleavers for permuting data for communications in these systems.

BACKGROUND

Techniques for encoding communication channels, known as coded modulation, have been found to improve the bit error rate (BER) of electronic communication systems such as modem and wireless communication systems. Turbo coded modulation has proven to be a practical, power-efficient, and bandwidth-efficient modulation method for "random-error" channels characterized by additive white Gaussian noise (AWGN) or fading. These random-error channels can be found, for example, in the Code Division Multiple Access (CDMA) environment.

An innovation of Turbo codes is the interleaver which permutes the original received or transmitted data frame. Conventional permuting of Turbo codes is accomplished by a processor performing a randomizing algorithm, the construction of which is well known.

Interleaving a sequence of data can be realized by reading linear array data from different memory locations. The "addressing rule" defines the permutation, which is the interleaving/de-interleaving rule. Such a memory based interleaver/de-interleaver scheme is called an indirect interleaver, since the construction of associated de-interleaver is not required.

Figure 1:
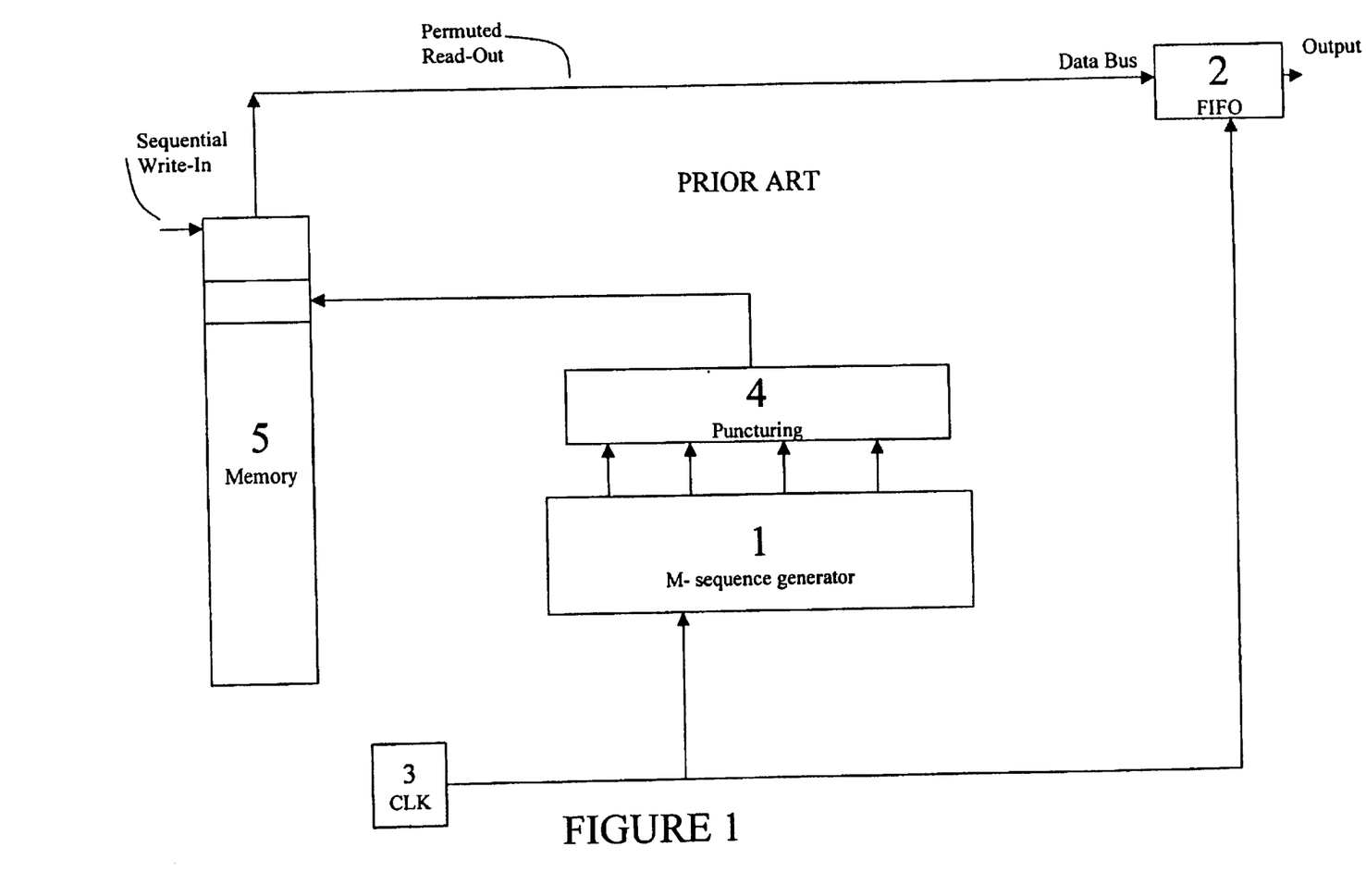
FIG. 1 is a conventional interleaver that uses an M-sequence generator as the basis for the random address generator.

FIG. 1 shows a conventional interleaver that uses an M-sequence register as the random address generator. A frame of data is written into sequential locations in a memory 5. An M-sequence generator 1 generates the addresses for a block of data at least as large as the frame, and in a sequence other than a linear sequence. These addresses are then used to read frame elements out of memory 5, except for addresses outside the frame size which are ignored by puncturing unit 4. Frame elements are thus read out of memory 5 in permuted order, and are buffered in a FIFO 2. A clock 3 clocks the M-sequence generator and also clocks FIFO 2. Although frame elements may emerge from memory 5 at an uneven ("bursty") rate because of puncturing, the output of FIFO 2 is at an even rate.

A problem with this type of non-uniform interleaving is the difficulty in achieving sufficient "non-uniformity", since the interleaving algorithms can only be based on pseudo-irregular patterns. Further, conventional interleavers require a significant amount of memory in the encoder. Conventional interleaving matrices also require delay compensations, which limit their use for applications with real-time requirements. Turbo code will be present in 3G CDMA both in the United States and Europe. Therefore, the performance of Turbo code interleavers is an important aspect of 3G CDMA. Another important issue is how to effectively implement an interleaver in an application.

Accordingly there exists a need for systems and methods of interleaving codes that improve non-uniformity.

There also exists a need for systems and methods of interleaving codes for 3G CDMA.

It is thus an object of the present invention to provide systems and methods of interleaving codes that improve non-uniformity.

It is also an object of the present invention to provide systems and methods of interleaving codes for 3G CDMA.

SUMMARY OF THE INVENTION

In accordance with the teachings of the present invention, these and other objects may be accomplished by the present invention, which is a Turbo code interleaver for use with 3G CDMA data. An embodiment of the invention includes an apparatus that receives and temporarily stores frames of data in a memory. A counter is connected to a table. The table includes addresses which may be selected by the counter. A clock is connected to the counter and an output buffer and is configured to synchronize them.

The addresses in the table can include the addresses of elements that are outside the frame size, therefore a puncturing device can be connected to the table. The puncturing device can be configured to discard any elements that are outside the frame size. This embodiment also includes a memory. The memory can be connected to the puncturing unit and to the buffer. Data are read out of the memory from addresses which are not discarded by the puncturing device, and are output through the buffer.

Another embodiment of the present invention is a method of interleaving 3G CDMA data. This embodiment includes receiving and temporarily storing data. Using a clock to synchronize the data with a counter ensures timing throughout the system is sampled correctly. This embodiment also includes storing a plurality of addresses in at least one table electrically connected to the counter. The counter is used to select the addresses. It can be configured to select some or all of the addresses. This embodiment further includes discarding the selected addresses if they are greater than a frame size, using a puncturing device electrically connected to the table. This embodiment also includes storing the data in address locations in a memory which is electrically connected to the puncturing unit, where the address locations correspond to the selected addresses which are not discarded.

Another embodiment of the present invention is an apparatus for interleaving 3G CDMA data. This embodiment includes a memory for receiving and temporarily storing the data. It further includes a counter module for counting, an output buffer module, and a clock module connected to the buffer module and the counter module, for synchronizing the buffer module and the counter module.

This embodiment also includes a table storage module for storing addresses. A puncturing module electrically connected to the table module is included for discarding selected addresses if they are outside the frame size.

DESCRIPTION OF THE DRAWINGS

The invention will be more clearly understood by reference to the following detailed description of an exemplary embodiment in conjunction with the accompanying drawings, in which.

DETAILED DESCRIPTION OF THE INVENTION

The present invention provides efficient implementations of Turbo code interleavers proposed for third generation code division multiple access (3G CDMA) standards.

Galois Field Random Interleaver

Figure 2:
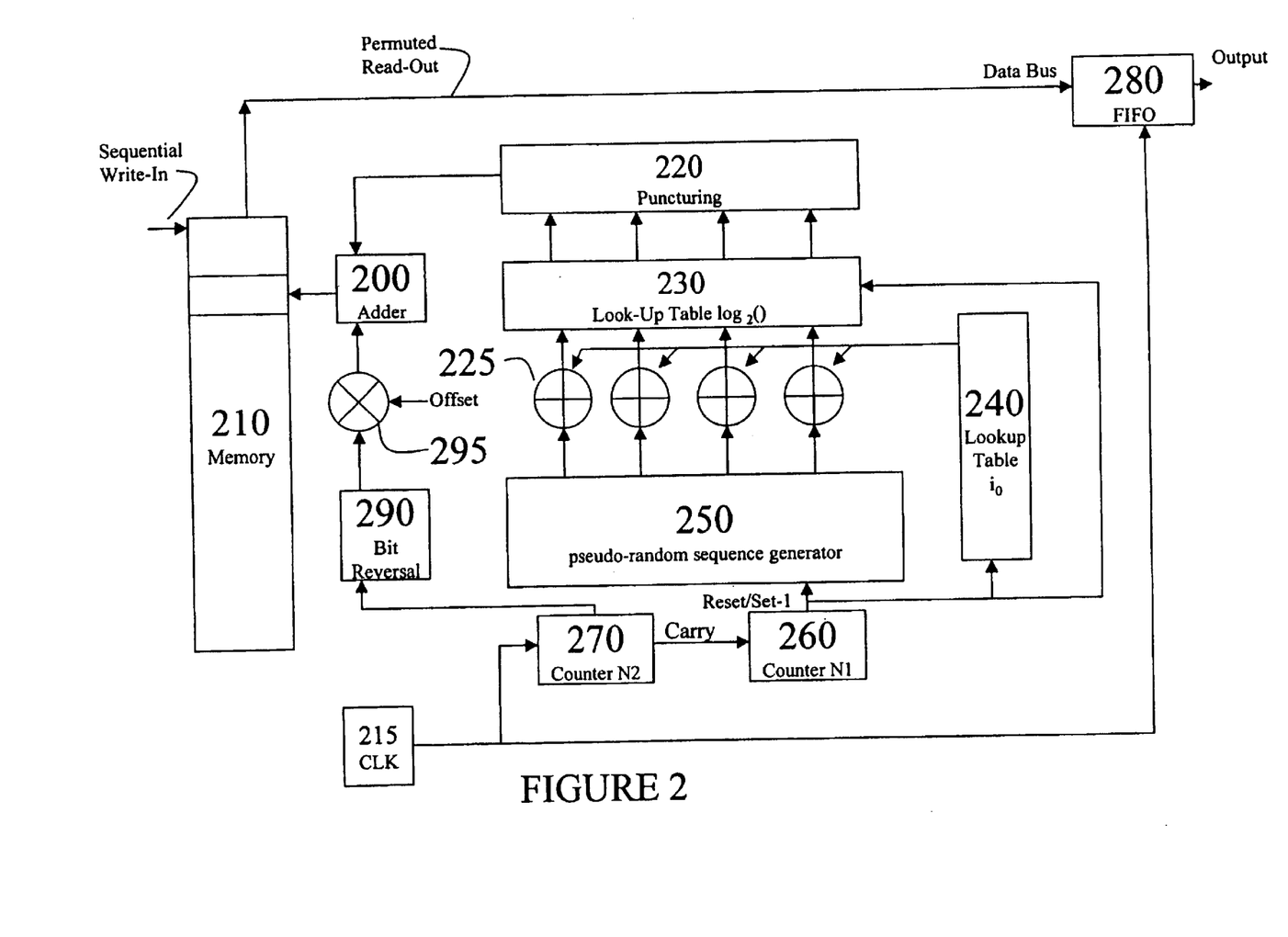
FIG. 2 is a schematic representation of a Galois Field type interleaver in accordance with the present invention.

FIG. 2 illustrates an embodiment of the present invention. This embodiment is an efficient implementation for the Galois Field interleaver. Data is permuted by pseudo-randomizing the indices of the working memory 210. The data are output to a FIFO buffer 280 after being read out in permuted fashion from the working memory 210.

The working memory 210 indices can be composed of two parts; columns and rows. The columns and rows can be generated by combining pseudo-random numbers with arranged numbers. In an embodiment the columns are the arranged numbers and the rows are the pseudo-random numbers. However those skilled in the art will realize that this is simply a design choice and can be reversed. In addition row and column can be referred to as most significant bit (MSB) or least significant bit (LSB).

A clock 215 triggers a two stage counter 270, 260. The counter initiates generation of the row and column components used to address the working memory 210. For example, for a frame size of 384, we may define N1=24 and N2=16, where N1 and N2 are representative of the number of rows and columns, respectively. Thus 384=24×16. The parameters N1 and N2 specify the values to which the counters are permitted to count, and can be changed in software or hardware. The first stage of the counter 270 (i.e. N2), counts to N2 and then sends a carry bit to the second stage of the counter 260 (N1 or column counter). As N2 is counting, a row element is generated. The row element can be further derived by reversing bits using a bit reverser 290. Thus, for a particular row address a corresponding bit-reversed address can be used. The following is an example of bit reversal:

| Input Data | Output Data |
|---|---|
| 000 | 000 |
| 001 | 100 |
| 010 | 010 |
| 011 | 110 |
| 100 | 001 |
| 101 | 101 |
| 110 | 011 |
| 111 | 111 |

The row portion of the memory index can also be multiplied by an offset by means of a multiplier 295. Any variable quantity produced in the embodiment may be used for the offset, or a constant may be used. A present embodiment uses the value of N1 for an offset. Those skilled in the art will realize that the bit reverser 290 may be replaced by an indexed table or real time number generator based on a random or non-random number sequence, and still be within the scope of this invention. Conversely, the bit reverser can be eliminated.

The row portion of the memory index is added to a column portion of the memory index to derive the memory index. For example, if the output of the multiplier 295 is 1010, and the output of the puncturing mechanism 220 is 0110 (explained below), then the output of the adder 200 is 1010 in the LSB portion of the address and 0110 in the MSB portion of the address. The memory index is the combination of the LSB and MSB. This can be accomplished by masking the LSB and MSB with 0000ffffH (i.e. LSB mask) and ffff0000H (i.e. MSB mask), respectively, and combining the results. For example:

$$1010_2 \& (0000\mathit{ffffH}) + 0110_2 \& (\mathit{ffff}0000H) = 01101010_2.$$

A column index can be generated by combining the contents of a lookup table 240 with a pseudo-random sequencer 250 (i.e. M-sequencer, Gold, Hadamard, Walsh sequencer or the like). Both the sequence generator 250 and the first lookup table 240 are controlled by the two-stage counter 270, 260. The pseudo-random number from the pseudo-random sequence generator 250 is combined by combiners 225 with a value from lookup table 240. This combination is used as an index to table 230, which in turn outputs a permuted column index. For example, if the column index is defined by:

$$j = \log(\alpha^{i_o} + \alpha^j)$$

where j is the column index and $i_o$ changes row by row as in the following example,

| i | $i_o$ |
|---|---|
| 0 | 0 |
| 1 | 2 |
| 2 | 5 |
| 3 | 5 | j can be restated as:

$$j = \log(\alpha^{i_o} + \alpha^j) = \alpha^x$$

where x can be found from the log table 230 defined by the Galois Field equation.

If the column index is out of range for a particular block size, then the output of the lookup Table 230 is discarded (i.e. punctured) by a puncturing unit 220. For example, if N=8, where N is the frame size, and the random sequence generated from table 220 is: [5 2 9 4 6 1 7 10 3 8], after puncturing, the sequence becomes [5 2 4 6 1 7 3 8] by removing the numbers larger than 8 from the original sequence.

If the column index is within range, then it is added to the row index and a permuted memory index is generated. This memory index, in turn, is used to address the memory 210 for retrieving data. Those skilled in the art will realize that the tables 230, 240 can be replaced with real time units that calculate the Galois Field pseudo-random numbers.

The FIFO buffer 280 smoothes the rate of data retrieved from memory 210 consistent with the clock rate. For example, at each clock cycle, the random interleaver generator generates the addresses such as [5 2 9 4 6 1 7 10 3 8] (i.e. before puncturing). However, if the data frame size were 8, the numbers 9 and 10 would be punctured. The M-sequence is reset if a fast carry sign from the counter is changed. Thus, after one clock cycle, the M-sequence generator is set to 1 and the sequence starts over. Those skilled in the art will realize that the entire unit can be made without working memory since the tables and pseudo-random sequences can be accomplished by real time number generators. Thus the received data can be permuted and output through FIFO buffer 280 in real time as it enters the system. The same is true for the following embodiments.

Figure 2A:
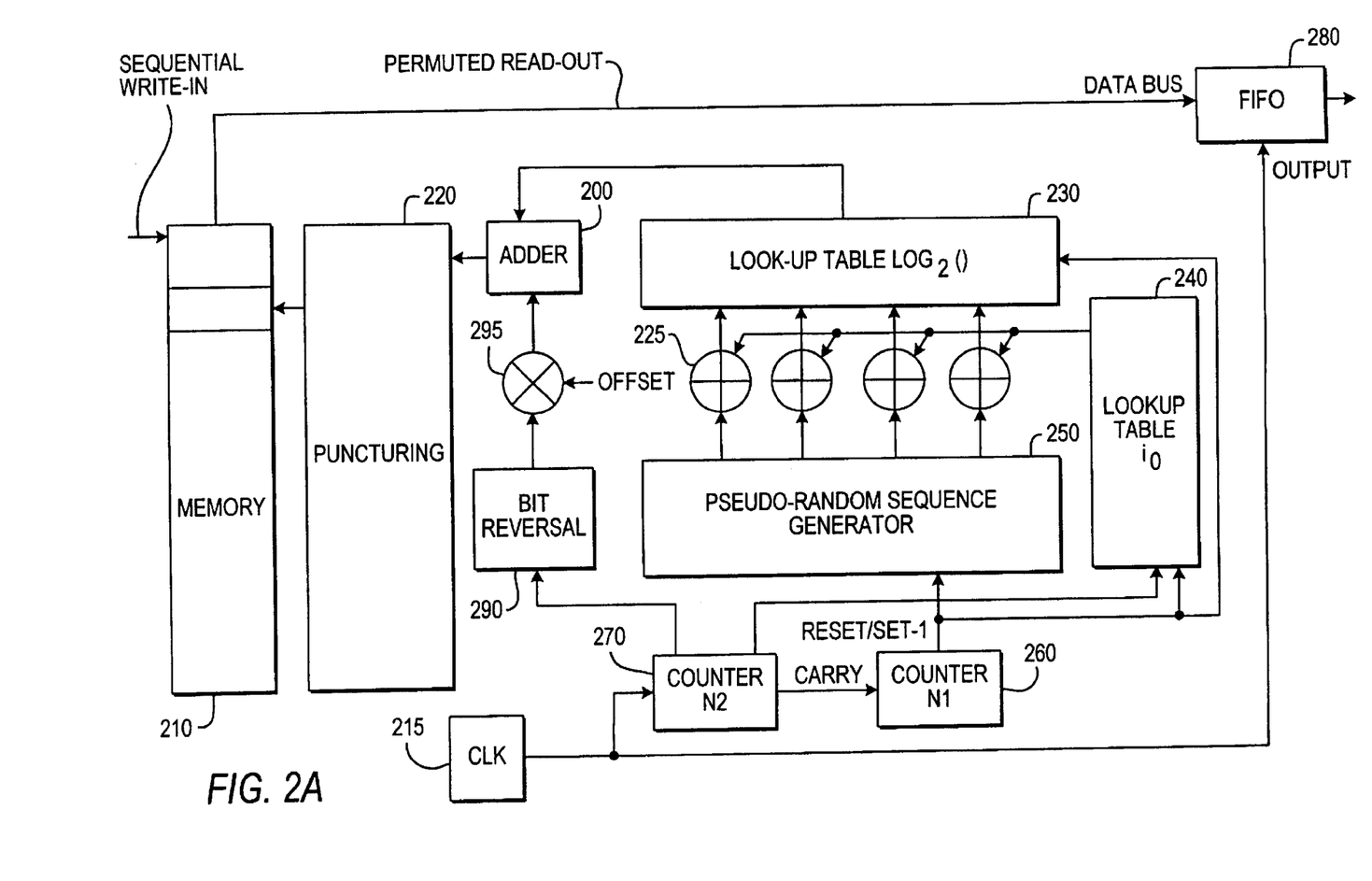
FIG. 2A is a variant of the interleaver depicted in FIG. 2.

FIG. 2A depicts puncturing unit 220 located after adder 200, rather than before it as in FIG. 2. This allows the puncturing to be determined by N2 and N1 jointly as arbitrary L<(N1*N2), rather than L<N1 . Also in FIG. 2A, N2 counter 270 provides an input to lookup table 240 along with the input from N1 counter 260, thus allowing column permutation to be row-independent.

Figure 4:
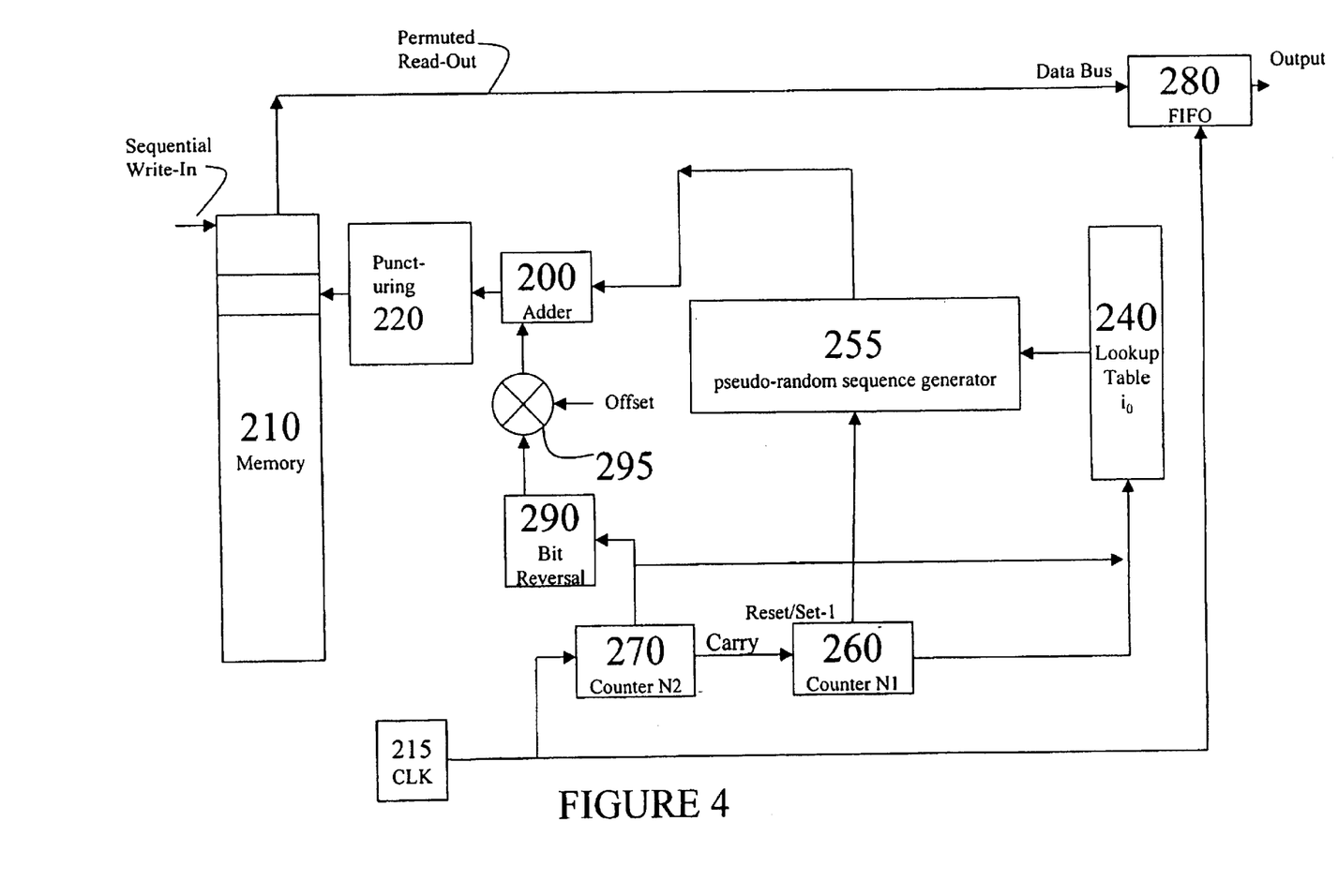
FIGS. 4 and 4A depict variants of interleavers.

FIG. 4 is simplified from FIG. 2A, regarding its depiction of sequence generation consolidated in sequence generator 255, which can be an algebraic type of sequence generator. As in FIG. 2A, N2 counter 270 provides some of the control of lookup table 240.

Figure 4A:
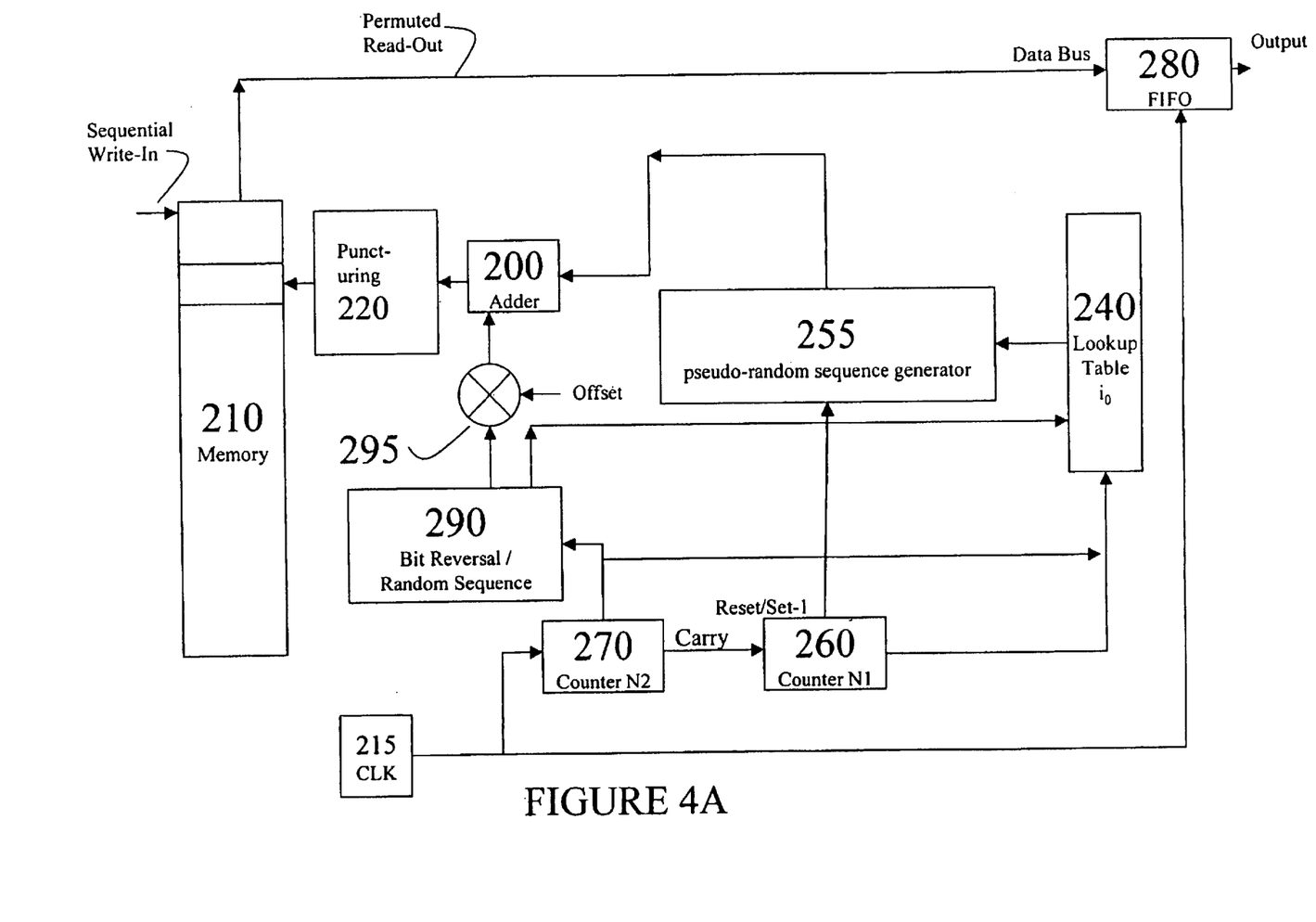

FIG. 4A shows block 290 able to function as a bit reverser or alternatively as a random sequence generator. Also shown is a connection from block 290 to block 240, providing additional input to lookup table 240.

Figure 3:
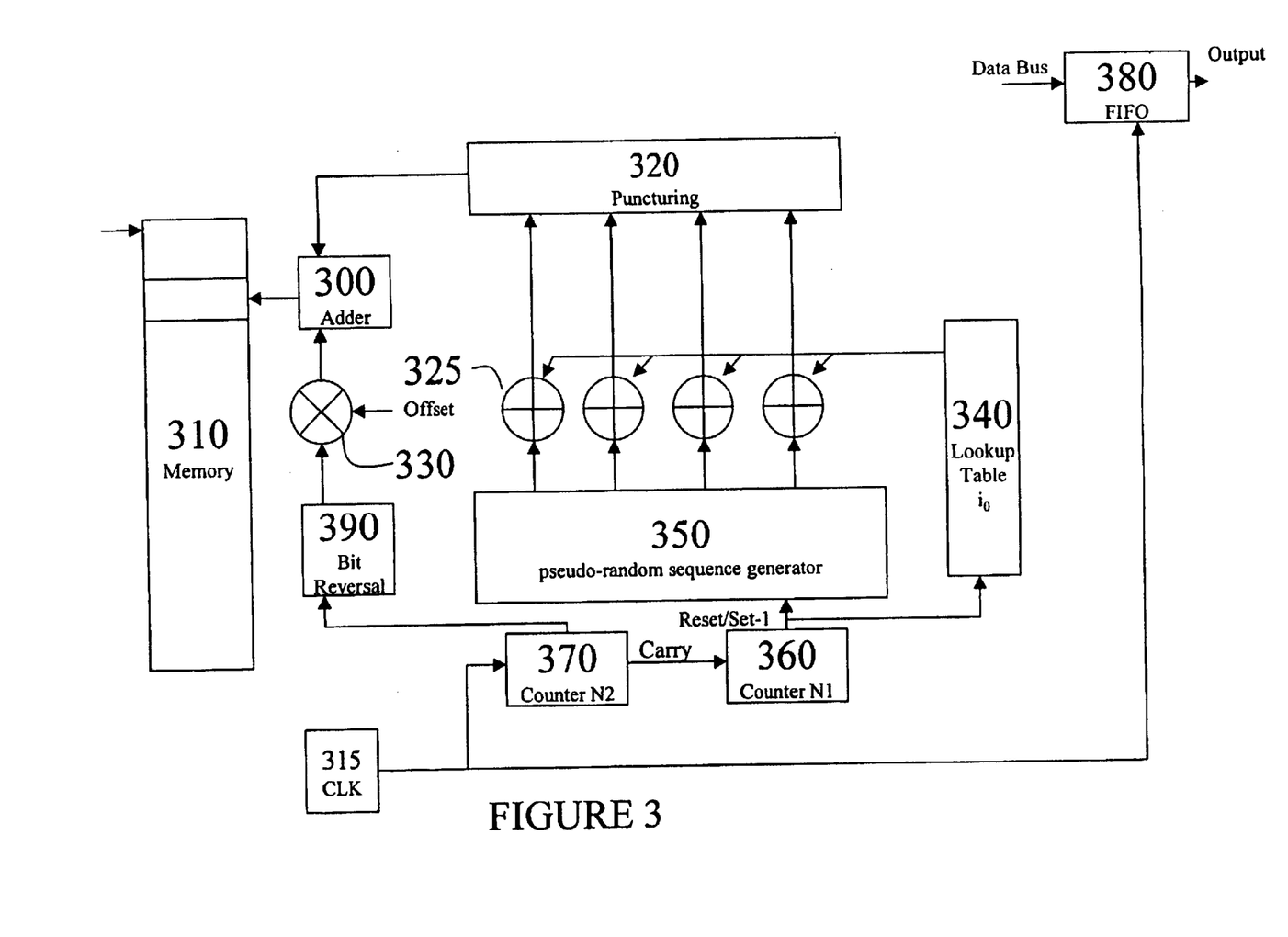
FIG. 3 is schematic representation of another embodiment of the Galois Field type interleaver of FIG. 2.

FIG. 3 shows another embodiment of the Galois Field interleaver. This embodiment is simplified by the removal of lookup Table 230. The embodiment may thus operate with a lower memory requirement.

Figure 4B:
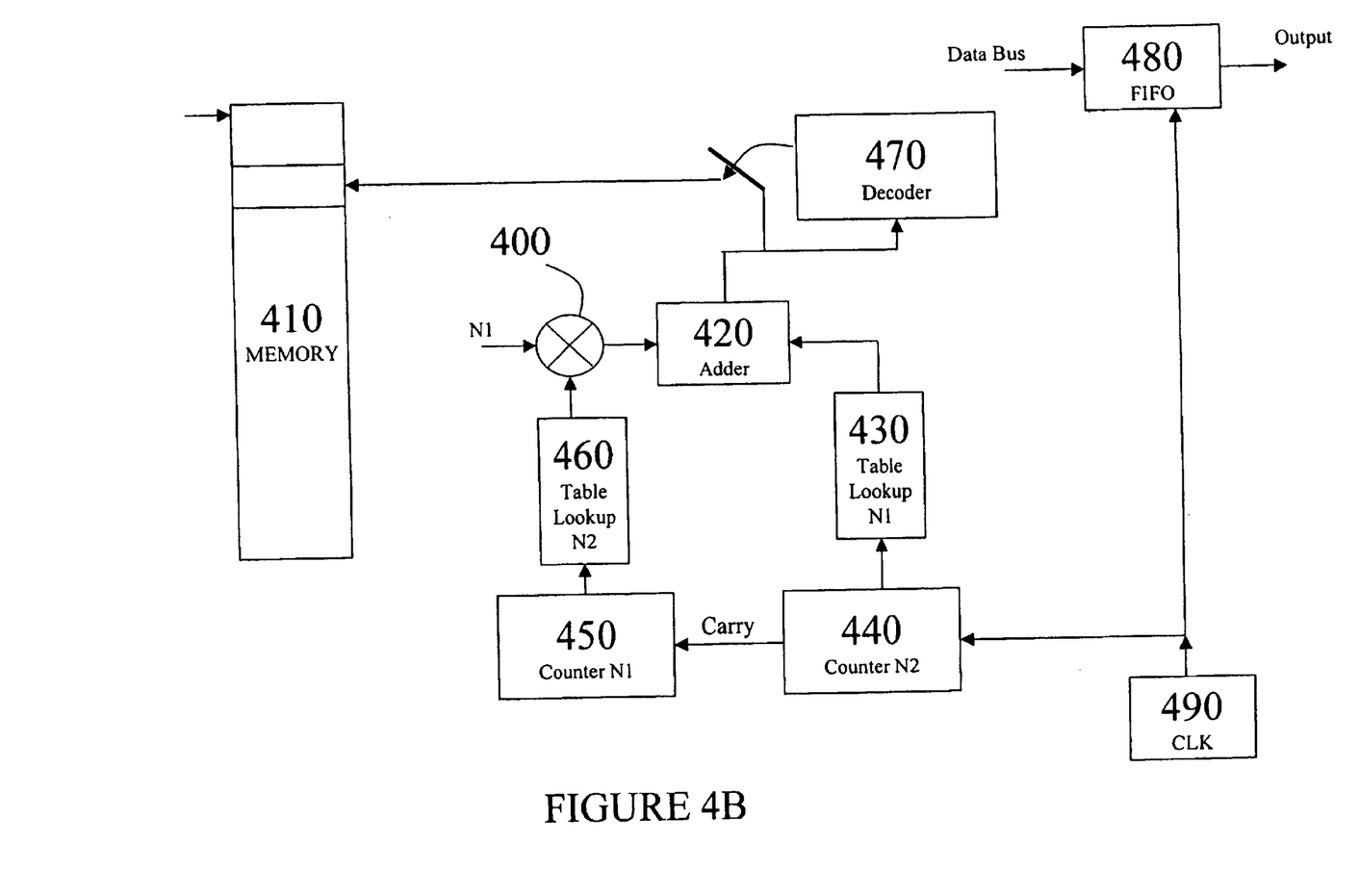
FIG. 4B is a schematic representation of an Algebraic type interleaver in accordance with the preset invention.

Algebraic Interleaver FIG. 4B illustrates another embodiment of the present invention. This embodiment is an efficient implementation of the Algebraic interleaver. The Algebraic interleaver can include tables which can be replaced by real-time pseudo-random generators. In addition, this embodiment can also include a puncturing unit (here called a decoder) 470, a multiplier 400, and an adder 420. These units perform the same functions as those described above. Since such an algebraic interleaver is parameterized it can be reconstructed with an arbitrary size by using a few parameters. This provides a significant advantage by reducing the memory requirement.

The interleaver contains two lookup tables 460, 430 and a two-stage counter 450, 440. The outputs of the two lookup tables are combined, where the tables are indexed by a two stage counter 440, 450. The table lookup 460 (i.e. N2), can be indexed by the N2 counter while the table lookup 430 can be indexed by every count generated by the N1 counter. The FIFO buffer 480 depth is minimized and the decoder 470 punctures the last M tail-bits, thus generating an address for a working memory within a frame size. In addition, the same counter 440, 450 can be re-used for the linear array write-in addressing.

Figure 5:
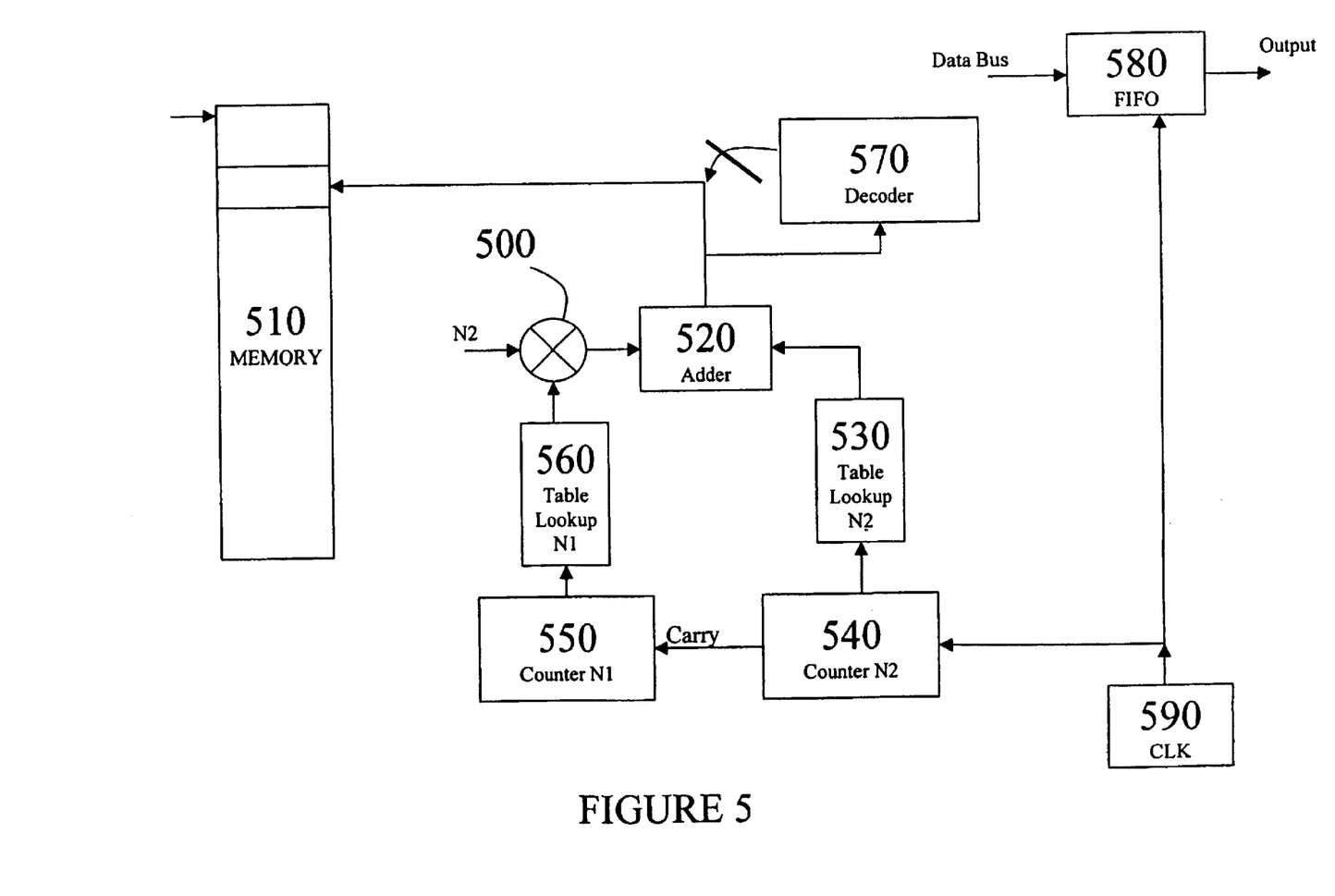
FIG. 5 is a schematic representation of a Direct Algebraic de-interleaver for de-interleaving the output of the algebraic interleaver shown in FIG. 4.

Since the algebraic interleaver is a row-by-row and column-by-column permuted block interleaver, a direct de-interleaver can be constructed for use with the algebraic interleaver. FIG. 5 depicts a direct Algebraic de-interleaver to de-interleave the output of the algebraic interleaver shown in FIG. 4. The corresponding inverse tables of N1 and N2 are denoted as/N1 and /JN2 respectively. The direct de-interleaver can also generate the de-interleaver address on-line (i.e., in real time) without the need for a working memory.

Algebraic Indirect Interleaver

Figure 6:
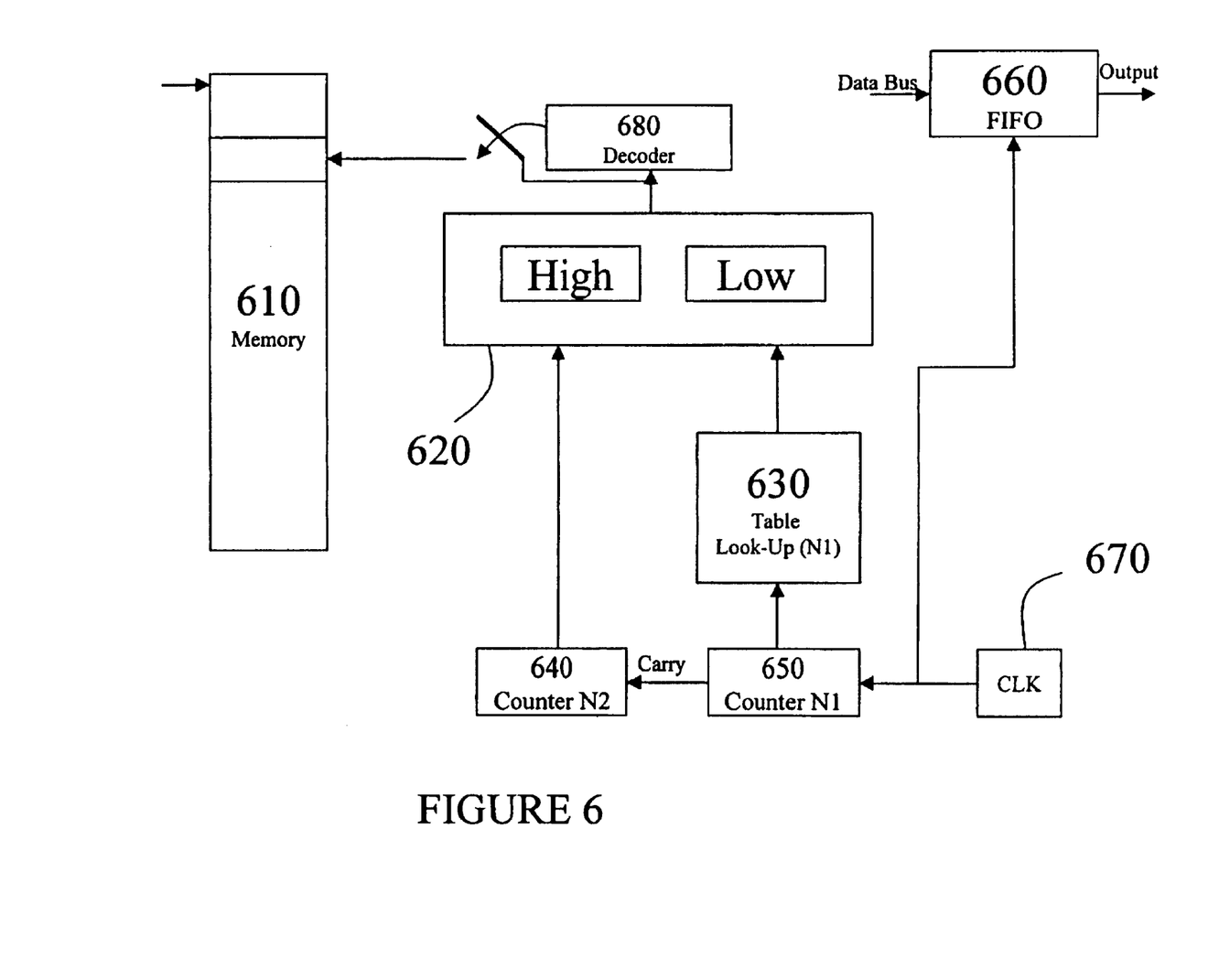
FIG. 6 is a schematic representation of an Indirect Algebraic type interleaver in accordance with the present invention.

Another embodiment of the invention is the Indirect Algebraic interleaver shown in FIG. 6. The Indirect Algebraic interleaver uses a linear block addressing unit 620 to combine the index components (i.e. row and column or MSB and LSB) necessary to pseudo-randomly read out from the working memory 610 to the buffer memory (FIFO) 660. The pointer to each block is the output of the table lookup N1 630 and a two-stage counter 640, 650. Thus, the block addressing unit 620 is used as an address generator by either indexing a tabled located within the clock addressing unit 620 (not shown) or by combining the counter 640 output with the table lookup 630 output. Thus, the N2 counter 640 is directly selecting the offset address, while the table lookup (N1) 630 is controlled by the N1 counter 650. The FIFO buffer 660 depth is minimized and the decoder 660 punctures any addresses greater than the frame size. A difference between this embodiment and the Algebraic Interleaver (shown in FIG. 4) is that only one table lookup is utilized to generate pseudo-random addresses.

Those skilled in the art will realize that instead of choosing a pseudo-random number to index a working memory (for transferring data stored in a FIFO buffer), the pseudo-random number can be used to index the FIFO buffer. The chosen input data from the FIFO buffer can then be sequentially written to working memory. Thus, the data can be stored sequentially into working memory (as opposed to pseudo-randomly) while the FIFO is addressed pseudo-randomly. To use the data in working memory, a sequential counter or other linear addressing module can be used to index the working memory.

It will be understood that changes may be made in the above construction and in the foregoing sequences of operation without departing from the scope of the invention. It is accordingly intended that all matter contained in the above description or shown in the accompanying drawings be interpreted as illustrative rather than in a limiting sense.

It is also to be understood that the following claims are intended to cover all of the generic and specific features of the invention as described herein, and all statements of the scope of the invention which, as a matter of language, might be said to fall therebetween.

Having described the invention, what is claimed as new and secured by Letters Patent is:

1. A Turbo code interleaver, comprising:

a memory for receiving and temporarily storing data in sequential locations;

a counter;

a table electrically coupled to said counter, wherein said table includes a plurality of addresses, and wherein ones of said plurality of addresses are selected in a pseudo-random sequence according to said counter;

a puncturing device electrically coupled to said table configured to discard ones of said selected plurality of addresses which are greater than a frame size; and said memory being configured to retrieve said data from said ones of said selected plurality of addresses which are not discarded;

a buffer for receiving and outputting said data from said memory; and a clock coupled to said buffer and said counter and configured to synchronize said buffer and said counter.

2. The Turbo code interleaver according to claim 1, further comprising:

a bit reverser electrically coupled to said counter, configured to reverse a set of bits output from said counter;

a multiplier, electrically coupled to said bit reverser, configured to offset said reversed set of counter bits;

a combiner electrically coupled to said puncturing device and said multiplier configured to generate a plurality of other memory addresses by combining said offset reversed counter bits with non-punctured ones of said plurality of addresses; and, said memory configured to retrieve said data from said plurality of other memory addresses.

3. The Turbo code interleaver according to claim 1, wherein said table comprises a real-time pseudo-random number generator, configured to generate pseudo-random numbers according to a predetermined formula.

4. The Turbo code interleaver according to claim 1, further comprising:

a number generator electrically coupled between said counter and said table, said number generator being configured to generate a plurality of table addresses;

wherein said counter controls said number generator; and wherein said plurality of table addresses are used to address said table.

5. The Turbo code interleaver according to claim 1, wherein said table comprises a plurality of second tables.

6. A method of interleaving, comprising:

receiving and temporarily storing data in sequential locations in a memory;

storing a plurality of addresses in a table;

providing a counter electrically coupled to said table;

selecting ones of said plurality of addresses using a pseudo-random sequence according to said counter;

discarding selected ones of said plurality of addresses which are greater than a frame size, using a puncturing device electrically coupled to said table; and, retrieving said data from non-discarded ones of said plurality of address locations in said memory;

synchronizing said data retrieval and said counter using clock.

7. The method of interleaving according to claim 6, further comprising:

reversing a set of bits received from said counter;

multiplying said reversed set of counter bits by an offset, wherein said offset is a predetermined number greater than zero;

generating a plurality of other memory addresses by combining said offset reversed set of counter bits with non-punctured ones of said plurality of addresses; and, retrieving said data from said plurality of other memory address locations in said memory.

8. The method of interleaving according to claim 6, further comprising:

generating in real time said pseudo-random numbers according to a predetermined formula.

9. The method of interleaving according to claim 6, further comprising:

generating a plurality of table addresses using a generator electrically coupled between said counter and said table;

controlling said generator using said counter; and addressing said table using said plurality of table addresses.

10. An apparatus for interleaving, comprising:

memory means for receiving temporarily storing data;

counter means for counting;

table storage means for storing a plurality of addresses and for selecting ones of said plurality of addresses using a pseudo-random sequence according to said counter;

puncturing means electrically coupled to said table means for discarding said ones of said selected plurality of addresses that are greater than a frame size; and memory readout means electrically coupled to said puncturing means for retrieving said data from said memory means at said ones of said selected plurality of addresses which are not discarded;

buffer means for outputting said data retrieved from said memory means; and clock means coupled to said buffer means and said counter means for synchronizing said buffer means and said counter means.

11. The apparatus according to claim 10, further comprising:

bit reverser means electrically coupled to said counter means for reversing a set of bits from said counter means;

multiplier means electrically coupled to said bit reverser means for offsetting said set of reversed counter bits, wherein said offset is a predetermined number greater than zero;

combiner means electrically coupled to said puncturing means and said multiplier means for generating a plurality of other memory addresses by combining said offset reversed set of counter bits with non-punctured ones of said plurality of addresses; and, said memory means for retrieving said data from said plurality of other memory addresses.

12. The apparatus according to claim 10, wherein said table means is a real-time pseudo-random number generator means for generating pseudo-random numbers according to a predetermined formula.

13. The apparatus according to claim 10, further comprising:
- generator means electrically coupled between said counter means and said table means for generating a plurality of table addresses; and,
- wherein said counter means controls said generator means; and
- wherein said table means is addressed using said plurality of table addresses.

14. A turbocode interleaver for interleaving elements of frames of data wherein a frame consists of N elements where N is a positive integer greater than one, the interleaver comprising:
- a memory for storing elements in addressable locations and for retrieving the elements from the addressable locations,
- wherein elements are stored in locations according to a first sequence of addresses which is a consecutive sequence, and elements are retrieved according to a second sequence of addresses;
- a clock for producing a clock signal;
- a first counter advanced by the clock signal for counting up through a value N2 where N2 is a positive integer;
- a second counter advanced by carries from the first counter for counting up through a value N1 where the product of N1 and N2 is a positive integer at least equal to N;
- an address generator for producing the second sequence of addresses as a pseudo-random sequence according to the first and second counters;
- a puncture circuit for suppressing retrieval of data from memory locations corresponding to values of a product of the first counter and the second counter that are greater than N; and
- a buffer for:
  - receiving N elements retrieved from the memory according to the second sequence of addresses, and forwarding the N elements at a rate determined by the clock signal.

15. A turbo interleaver as recited in claim 14, wherein the address generator includes:
- a bit reverser for producing a reversed N2 field being the reverse of a bit pattern in the first counter;
- a pseudo-random number generator for producing a pseudo-random number according to a bit pattern in the second counter;
- a multiplier for multiplying the reversed N2 field by an offset to form a multiplier output; and
- an adder for adding the multiplier output and the pseudo-random number to produce a member of the second sequence of addresses.

16. Apparatus for interleaving elements of frames of data wherein a frame consists of N elements where N is a positive integer greater than one, the apparatus comprising:
- storage means for storing elements in addressable locations and for retrieving the elements from the addressable locations,
- wherein elements are stored in locations according to a first sequence of addresses which is a consecutive sequence, and elements are retrieved according to a second sequence of addresses;
- clock means for producing a clock signal;
- first counter means advanced by the clock signal for counting up through a value N2 where N2 is a positive integer;
- second counter means advanced by carries from the first counter means for counting up through a value N1 where the product of N1 and N2 is a positive integer at least equal to N;
- address generation means for producing the second sequence of addresses as a pseudo-random sequence according to the first and second counter means;
- puncturing means for suppressing retrieval of data from storage means locations corresponding to values of a product of the first counter and the second counter that are greater than N; and
- buffer means for:
  - receiving N elements retrieved from the storage means according to the second sequence of addresses, and forwarding the N elements at a rate determined by the clock signal.

17. The apparatus as recited in claim 16, wherein the address generation means includes:
- bit reversing means for producing a reversed N2 field being the reverse of a bit pattern in the first counter means;
- pseudo-random number generation means for producing a pseudo-random number according to a bit pattern in the second counter;
- multiplication means for multiplying the reversed N2 field by an offset to form a multiplied output; and
- addition means for adding the multiplied output and the pseudo-random number to produce a member of the second sequence of addresses.

18. A method of interleaving elements of frames of data wherein a frame consists of N elements where N is a positive integer greater than one, the interleaver comprising:
- storing elements in addressable locations and for retrieving the elements from the addressable locations,
- wherein elements are stored in locations according to a first sequence of addresses which is a consecutive sequence, and elements are retrieved according to a second sequence of addresses;
- producing a clock signal;
- counting occurrences of the clock signal in a first count up through a value N2 where N2 is a positive integer;
- counting carries from the first count in a second count up through a value N1 where the product of N1 and N2 is a positive integer at least equal to N;
- producing the second sequence of addresses as a pseudo-random sequence according to the first and second counts;
- suppressing retrieval of elements corresponding to values of a product of the first counter and the second counter that are greater than N;
- buffering N elements retrieved according to the second sequence of addresses; and
- forwarding the N elements at a rate determined by the clock signal.

19. The method recited in claim 18, wherein the step of producing the second sequence of addresses includes:
- producing a reversed N2 field being the reverse of a bit pattern in the first count;
- producing a pseudo-random number according to a bit pattern in the second count;
- multiplying the reversed N2 field by an offset to form a product; and
- adding the product and the pseudo-random number to produce a member of the second sequence of addresses.

20. A method of interleaving, comprising:

receiving and temporarily storing data in sequential locations in a memory;

storing a plurality of addresses in a table;

providing a counter electrically coupled to said table;

selecting ones of said plurality of addresses according to said counter;

discarding selected ones of said plurality of addresses which are greater than a frame size, using a puncturing device electrically coupled to said table;

retrieving said data from non-discarded ones of said plurality of address locations in said memory;

synchronizing said data retrieval and said counter using a clock;

reversing a set of bits received from said counter;

multiplying said reversed set of counter bits by an offset, wherein said offset is a predetermined number greater than zero;

generating a plurality of other memory addresses by combining said offset reversed set of counter bits with non-punctured ones of said plurality of addresses; and, retrieving said data from said plurality of other memory address locations in said memory.

21. An apparatus for interleaving, comprising:

memory means for receiving temporarily storing data;

counter means for counting;

table storage means for storing a plurality of addresses and for furnishing ones of said addresses in a sequence according to said counter;

puncturing means electrically coupled to said table means for discarding said ones of said selected plurality of addresses that are greater than a frame size;

memory readout means electrically coupled to said puncturing means for retrieving said data from said memory means at said ones of said selected plurality of addresses which are not discarded;

buffer means for outputting said data retrieved from said memory means; clock means coupled to said buffer means and said counter means for synchronizing said buffer means and said counter means;

bit reverser means electrically coupled to said counter means for reversing a set of bits from said counter means;

multiplier means electrically coupled to said bit reverser means for offsetting said set of reversed counter bits, wherein said offset is a predetermined number greater than zero;

combiner means electrically coupled to said puncturing means and said multiplier means for generating a plurality of other memory addresses by combining said offset reversed set of counter bits with non-punctured ones of said plurality of addresses; and, said memory means for retrieving said data from said plurality of other memory addresses.

* * * * *